(12) United States Patent
Nakatani et al.

(10) Patent No.: US 7,123,073 B2
(45) Date of Patent: Oct. 17, 2006

(54) AMPLIFIER AND FREQUENCY CONVERTER

(75) Inventors: Toshifumi Nakatani, Izumi (JP); Jyunji Itoh, Hirakata (JP); Hideo Nakano, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 75 days.

(21) Appl. No.: 10/506,078

(22) PCT Filed: Mar. 18, 2003

(86) PCT No.: PCT/JP03/03220

§ 371 (c)(1),
(2), (4) Date: Aug. 31, 2004

(87) PCT Pub. No.: WO03/084054

PCT Pub. Date: Oct. 9, 2003

(65) Prior Publication Data

US 2005/0110555 A1   May 26, 2005

(30) Foreign Application Priority Data

Mar. 28, 2002  (JP) .............................. 2002-091869

(51) Int. Cl.
G06F 7/44 (2006.01)
(52) U.S. Cl. .................... 327/358; 327/359; 327/67
(58) Field of Classification Search ............... 327/358, 327/359, 361, 67
See application file for complete search history.

(56) References Cited

U.S. PATENT DOCUMENTS

| | | | |
|---|---|---|---|
| 5,237,288 A | 8/1993 | Cleveland | 330/107 |
| 5,942,929 A | 8/1999 | Aparin | 327/233 |
| 6,018,270 A | 1/2000 | Stuebing et al. | 330/278 |
| 6,255,889 B1* | 7/2001 | Branson | 327/359 |
| 6,396,330 B1* | 5/2002 | Fujii | 327/355 |
| 6,404,263 B1* | 6/2002 | Wang | 327/359 |
| 2005/0062540 A1* | 3/2005 | Nakatani et al. | 330/294 |

FOREIGN PATENT DOCUMENTS

| | | |
|---|---|---|
| EP | 1 067 679 | 1/2001 |
| JP | 4-269005 | 9/1992 |

(Continued)

OTHER PUBLICATIONS

Karimi-Sanjaani et al., "A 2 Ghz Merged CMOS LNA and Mixer for WCDMA", 2001 Symposium on VLSI Circuits Digest of Technical Papers, Kyoto, Japan, Jun. 14-16, 2001, Symposium on VLSI Circuits, Tokyo: JSAP, JP, Jun. 14, 2001, pp. 19-22, XP010551482, ISBN: 4-89114-014-3.

*Primary Examiner*—Long Nguyen
(74) *Attorney, Agent, or Firm*—Wenderoth, Lind & Ponack, L.L.P.

(57) ABSTRACT

An amplifier circuit amplifies a differential signal supplied by a pair of input terminals. A phase controller circuit is placed between the emitters of two bipolar transistors and the ground. A feedback circuit is placed across the input and the output of the amplifier circuit for feeding the output of the amplifier circuit back to the input thereof. A phase change amount in the amplifier circuit is determined by the values of two inductors, whereas a phase change amount in the feedback circuit is determined by the values of two resistances and capacitors. The values of these devices are selected so that a phase difference between an input signal and a feedback signal is approximately 180 degrees in a range from the frequency of a fundamental wave of the input signal to the frequency of a second harmonic thereof.

8 Claims, 16 Drawing Sheets

FOREIGN PATENT DOCUMENTS

| | | |
|---|---|---|
| JP | 6-216670 | 8/1994 |
| JP | 7-022849 | 1/1995 |
| JP | 7-94954 | 4/1995 |
| JP | 9-167925 | 6/1997 |
| JP | 10-22751 | 1/1998 |
| JP | 10-335954 | 12/1998 |
| JP | 11-500276 | 1/1999 |
| JP | 2000-261265 | 9/2000 |
| WO | 96/25791 | 8/1996 |

* cited by examiner

AMPLIFIER AND FREQUENCY CONVERTER

TECHNICAL FIELD

The present invention relates to amplifiers for amplifying an input signal, and frequency converters for amplifying an input signal and then converting the frequency of the amplified signal. More specifically, the present invention relates to an amplifier and a frequency converter both having a wide dynamic range and suitable for integration into a semiconductor integrated circuit.

BACKGROUND ART

In receivers of a wireless system, typified by cellular phones, a signal received at an antenna is amplified by an amplifier circuit at an initial stage. Such an initial-stage amplifier circuit is required to have characteristics of achieving low noise and high gain when receiving a weak signal, while achieving low distortion and low gain when receiving a large signal. Particularly, in recent mobile communications, since the characteristics of a reception electric field are greatly varied in accordance with a distance between a base station and a mobile station, a wider dynamic range is required than ever in a receiving system. Moreover, an amplifier circuit at a reception front end requires stricter low noise characteristics than ever.

In order to stabilize the operation of the amplifier circuit, a scheme widely used is inserting a resistance between a signal line and the ground at the input or output of the amplifier circuit. However, insertion of the resistance at the input side causes severe degradation in noise characteristics. Insertion of the resistance at the output side, on the other hand, causes sever degradation in distortion characteristics. Other known schemes for stabilizing the operation of the amplifier circuit include a scheme of applying negative feedback to the input. That is, in this scheme, a signal shifted in phase by 180 degrees is fed back to the input. According to this scheme, it is possible to achieve an amplifier circuit generally having a wide dynamic range, although noise and distortion characteristics are both slightly degraded. Better still, a negative feedback circuit used in this scheme can also operate as a distortion compensator circuit, thereby making the dynamic range still wider with some contrivances of the circuit configuration.

Hereinafter, with reference to FIGS. 12 through 16, five conventional negative feedback amplifiers are exemplarily described. A first conventional example is a "negative feedback power amplifier" disclosed in Japanese Patent Laid-Open Publication No. 10-22751 (1998-22751) (refer to FIG. 12). The amplifier illustrated in FIG. 12 includes a negative feedback circuit which is capable of operating as a distortion compensator circuit and is used in a microwave band. In FIG. 12, transistors 601 and 602 are both field-effect transistors. Inductors 603, 604, and 605, and capacitors 606 and 607 form a matching circuit for the transistors 601 and 602. A microstrip line 608 serves as a phase shifter. A power voltage Vcc is applied via the microstrip line 608 to the amplifier.

Part of an output signal from the transistor 602 is fed via the inductor 605, the microstrip line 608, and then the inductor 604 back to the input of the transistor 602. Here, a length L of the microstrip line 608 is adjusted so that the feedback signal and the output signal from the transistor 602 are different in phase from each other by 180 degrees. With part of the output signal including a distortion component being inverted in phase for feedback to the input, distortion characteristics in a high frequency band can be improved.

A second conventional example is a "high-output amplifier" disclosed in Japanese Patent Laid-Open Publication No. 6-216670 (1994-216670) (refer to FIG. 13). The amplifier illustrated in FIG. 13 includes strip lines 701a and 701b as signal lines, a signal-amplifying transistor 702, a directional coupler 703, a feedback strip line 704, a stub 705, resistances 706a and 706b for changing the amount of feedback, a level detector circuit 707, a harmonic suppression controller circuit 708, and a terminator resistance 709.

In FIG. 13, an input supplied via the signal-line strip line 701a is amplified by the signal-amplifying transistor 702. An output from the transistor 702 is fed, via the feedback strip line 704 having a predetermined line length and then the directional coupler 703, back to the input of the signal-amplifying transistor 702 for signal amplification. With this, what is fed back to the input of the signal-amplifying transistor 702 is a signal opposite in phase to a second harmonic. As such, with the distortion of the second harmonic being cancelled, the linearity of the signal-amplifying transistor 702 can be improved.

A third conventional example is an "amplifier" disclosed in PCT International Publication No. WO96/25791 (refer to FIG. 14). The amplifier illustrated in FIG. 14 includes a transistor 801, signal sources 802 and 803, a signal source resistance 804, an input matching circuit composed of components denoted by 805, 806, 807, 808, and 809, an output matching circuit composed of components denoted by 810, 811, and 815, a band-pass filter 812, a phase shifter 813, a variable attenuator 814, and a load resistance 816.

In FIG. 14, the band-pass filter 812 passes a second harmonic of an output from the transistor 801. The phase shifter 813 and the variable attenuator 814 adjust the phase and amplitude of the second harmonic, respectively, In this amplifier, as with the second conventional example, the second harmonic of the output signal is fed back to the input, thereby reducing the third-order intermodulation product of the amplifier.

A fourth conventional example is a "power amplifier" disclosed in Japanese Patent Laid-Open Publication No. 7-94954 (1995-94954) (refer to FIG. 15). The amplifier illustrated in FIG. 15 includes a combiner 901, a power amplifier 902, a divider 903, a filter 904, a variable phase shifter 905, and a variable attenuator 906. This amplifier phase-shifts a fundamental wave and higher order waves (a second or third-or fourth-order harmonic, etc.) of the output from the power amplifier 902 by 180 degrees in a wide band, and the resultant wave is fed back to the input of the power amplifier 902. As such, with the fundamental wave and the second harmonic of the output from the power amplifier 902 being negatively fed back to the input, distortion of the output signal can be compensated.

A fifth conventional example is a "wide-band feedback amplifier" disclosed in Japanese Patent Laid-Open Publication 10-335954 (1998-335954) (refer to FIG. 16). The amplifier illustrated in FIG. 16 includes an amplifying device 1001, a signal input 1002, a signal output 1003, a slot line ground plane 1004, a slot line open plane 1005, a strip line 1006, a microstrip line 1007 in a lot line conversion part, a slot line 1008, via holes 1009, through holes 1010, and a resistance 1011 for determining the amount of feedback. As with the fourth conventional example, this amplifier shifts the phase of the output from the amplifying device 1001 by 180 degrees in a wide band, and then feeds the results back to the input of the amplifying device 1001. As such, with the fundamental wave and the second harmonic of the output from the amplifying device 1001 being fed back to the input, distortion of the output signal can be compensated. The gazette of this publication discloses a specific example of a feedback circuit for phase shift by 180 degrees in a wide band.

However, the above first through fifth conventional examples have the following drawbacks. In the amplifier of the first conventional example, the second harmonic is shifted in phase by almost 360 degrees for feedback to the input. Therefore, this amplifier does not perform distortion compensation by negative feedback of the second harmonic. In the amplifiers of the second and third conventional examples, the fundamental wave is hardly fed back. Therefore, these amplifiers do not perform distortion compensation by negative feedback of the third-order intermodulation wave occurring at a frequency in the vicinity of the frequency of the fundamental wave. Furthermore, in the amplifiers of the fourth and fifth conventional examples, a process of phase adjustment made to both of the fundamental wave and the harmonic is performed only by the feedback circuit, thereby making the feedback circuit complex in structure and increased in size.

DISCLOSURE OF THE INVENTION

Therefore, an object of the present invention is to provide a negative feedback amplifier and a negative feedback frequency converter each of simple structure, capable of providing negative feedback of the phases of a fundamental wave, a third-order intermodulation wave, and a second harmonic to the input, and suitable for integration into a semiconductor integrated circuit.

To achieve the above objects, the present invention has the following aspects.

A first aspect of the present invention is directed to an amplifier for amplifying a differential signal composed of an in-phase signal and an opposite-phase signal. The amplifier includes: an amplifier circuit, placed on a path from an input terminal to an output terminal, for amplifying the differential signal input via the input terminal; a feedback circuit, placed across an input and an output of the amplifier circuit, for feeding the output of the amplifier circuit back to the input of the amplifier circuit while changing a phase of the differential signal passing through the feedback circuit; and a phase controller circuit, placed between adjusting terminals of the amplifier circuit and ground, for changing the phase of the differential signal passing through the amplifier circuit. Here, the amplifier circuit includes an in-phase amplifying section having an in-phase adjusting terminal, which is one of the adjusting terminals, and operating based on the in-phase signal of the differential signal, and an opposite-phase amplifying section having an opposite-phase adjusting terminal, which is another one of the adjusting terminals, and operating based on the opposite-phase signal of the differential signal. The feedback circuit includes an in-phase feedback section that operates based on the in-phase signal and an opposite-phase feedback section that operates based on the opposite-phase signal.

According to the above-stated first aspect, with appropriate selection of the characteristics of the feedback circuit and the amplifier circuit, a fundamental wave, a third-order intermodulation wave, and a second-order harmonic of the input signal can be negatively fed back with a simple structure. Therefore, it is possible to provide an amplifier having a wide dynamic range.

A second aspect of the present invention is directed to a frequency converter for amplifying a differential signal composed of an in-phase signal and an opposite-phase signal, and converting a frequency of the amplified differential signal for output. The frequency converter includes: an amplifier circuit, placed on a path from an input terminal to an output terminal, for amplifying the differential signal input via the input terminal; a frequency converter circuit for converting the frequency of the differential signal amplified by the amplifier circuit; a feedback circuit, placed across an input and an output of the amplifier circuit, for feeding the output of the amplifier circuit back to the input of the amplifier circuit while changing a phase of the differential signal passing through the feedback circuit; and a phase controller circuit, placed between adjusting terminals of the amplifier circuit and ground, for changing the phase of the differential signal passing through the amplifier circuit. Here, the amplifier circuit includes an in-phase amplifying section having an in-phase adjusting terminal, which is one of the adjusting terminals, and operating based on the in-phase signal of the differential signal, and an opposite-phase amplifying section having an opposite-phase adjusting terminal, which is another one of the adjusting terminals, and operating based on the opposite-phase signal of the differential signal. The feedback circuit includes an in-phase feedback section operating based on the in-phase signal and an opposite-phase feedback section operating based on the opposite-phase signal.

According to the above-stated second aspect, with appropriate selection of the characteristics of the feedback circuit and the amplifier circuit, a fundamental wave, a third-order intermodulation wave, and a second-order harmonic of the input signal can be negatively fed back with a simple structure. Therefore, it is possible to provide a frequency converter having a wide dynamic range.

In the above first and second aspects, it is preferable that a sum of a phase change amount in the feedback circuit and a phase change amount in the amplifier circuit is approximately 180 degrees at least in a range from a frequency of a fundamental wave of the differential signal supplied by the input terminal to a frequency of a second harmonic of the differential signal.

Furthermore, the phase controller circuit may include first through third phase adjusting sections each having two ends, one of the two ends being connected to a single connecting point, another end of the first phase adjusting section being connected to the in-phase adjusting terminal, another end of the second phase adjusting section being connected to the opposite-phase adjusting terminal, and another end of the third phase adjusting section being grounded. In this structure, the fundamental wave, the third-order intermodulation wave, and the second harmonic of the input signal can be negatively fed back with high flexibility.

Alternatively, the in-phase adjusting terminal and the opposite-phase adjusting terminal may be directly connected to each other, and the phase controller circuit may include a phase adjusting section having two ends, one of the two ends being connected to the in-phase adjusting terminal and the opposite-phase adjusting terminal, and another end being grounded. In this structure, the fundamental wave, the third-order intermodulation wave, and the second harmonic of the input signal can be negatively fed back with a simple structure while differential circuits in the differential amplifier circuit keep forming a good pair.

BEST MODE FOR CARRYING OUT THE INVENTION (First Embodiment)

Figure 1:
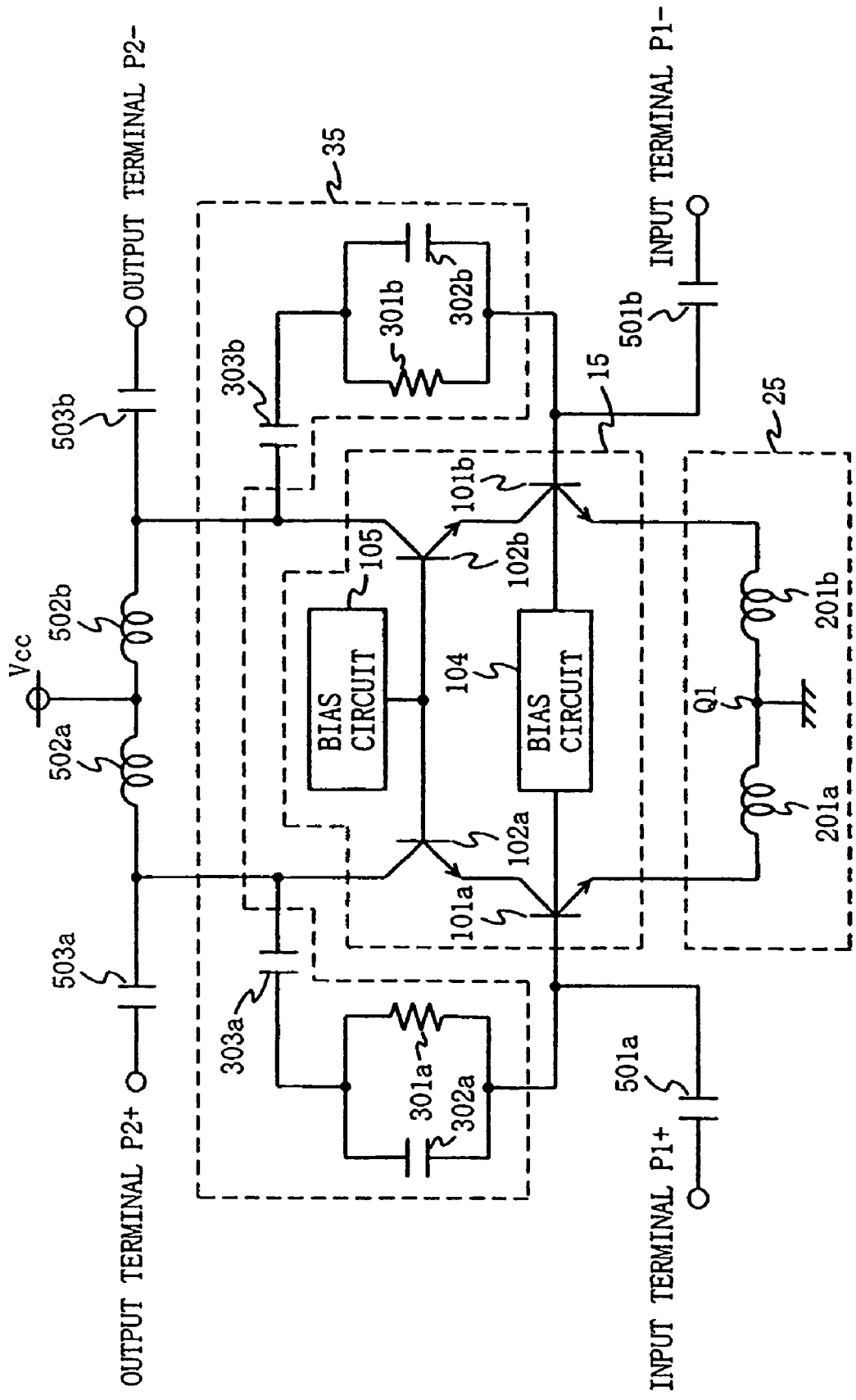
FIG. 1 is a circuit diagram of an amplifier according to a first embodiment of the present invention.

FIG. 1 is a circuit diagram of an amplifier according to a first embodiment of the present invention. The amplifier illustrated in FIG. 1 includes an amplifier circuit 15, a phase controller circuit 25, a feedback circuit 35, DC cut capacitors 501a, 501b, 503a, and 503b, and choke inductors 502a and 502b. This amplifier has a feature where the operations of the phase controller circuit 25 and the feedback circuit 35 cause a phase difference of approximately 180 degrees between an input signal and a feedback signal. Also, the amplifier is used mainly in a high frequency band. Furthermore, the amplifier circuit 15, the phase controller circuit 25, and the feedback circuit 35 of the amplifier are each structured by a differential pair.

The amplifier circuit 15 includes bipolar transistors 101a, 101b, 102a, and 102b, and bias circuits 104 and 105. The amplifier circuit 15 amplifies a differential signal input via a pair of input terminals {P1+, P1−}. The phase controller circuit 25 includes inductors 201a and 201b. These inductors 201a and 201b are used for adjusting the passing phase of the amplifier circuit 15. The feedback circuit 35 includes resistances 301a 301b, capacitors 302a and 302b, and DC cut capacitors 303a and 303b, so as to feed the output of the amplifier circuit 15 back to the input thereof. The resistances 301a and 301b and the capacitors 302a and 302b are used for adjusting the passing phase of the feedback circuit 35.

In the amplifier illustrated in FIG. 1, the input terminal P1+ is connected via the DC cut capacitor 501a to the base of the bipolar transistor 101a, whereas the input terminal P1− is connected via the DC cut capacitor 501b to the base of the bipolar transistor 101b. The collectors of the bipolar transistors 101a and 101b are connected to the emitters of the bipolar transistors 102a and 102b, respectively. The collector of the bipolar transistor 102a is connected via the DC cut capacitor 503a to an output terminal P2+, whereas the collector of the bipolar transistor 102b is connected via the DC cut capacitor 503b to an output terminal P2−. The emitters of the bipolar transistors 101a and 101b serve as terminals for adjusting the phase of the amplifier circuit 15, and are connected to the inductors 201a and 201b, respectively, at one end each. At the other end each, the inductors 201a and 201b are connected to each other, and their connecting point Q1 is grounded. The base of each of the bipolar transistors 101a and 101b is supplied with a base current from the bias circuit 104. The base of each of the bipolar transistors 102a and 102b is supplied with a base current from the bias circuit 105.

The resistance 301a and the capacitor 302a are connected to each other in parallel so as to form a parallel circuit. This parallel circuit and the DC cut capacitor 303a are inserted in series between the base of the bipolar transistor 101a and the collector of the bipolar transistor 102a. The resistance 301b and the capacitor 302b are connected to each other in parallel so as to form a parallel circuit. This parallel circuit and the DC cut capacitor 303b are inserted in series between the base of the bipolar transistor 101b and the collector of the bipolar transistor 102b. The power voltage Vcc is supplied via the choke inductor 502a to the collector of the bipolar transistor 102a, and via the choke inductor 502b to the collector of the bipolar transistor 102b.

With reference to FIGS. 2A through 2F, the operation of the amplifier illustrated in FIG. 1 is described below. Here, passing phase characteristics are studied below on the following three circuits: a circuit illustrated in FIG. 2A including the bipolar transistors 101a, 101b, 102a, and 102b and the inductors 201a and 201b; a circuit illustrated in FIG. 2B including the resistance 301a and the capacitor 302a; and a circuit illustrated in FIG. 2C having therein the circuit illustrated in FIG. 2A and two of the circuit illustrated in FIG. 2B being connected to one another.

Figure 2A:
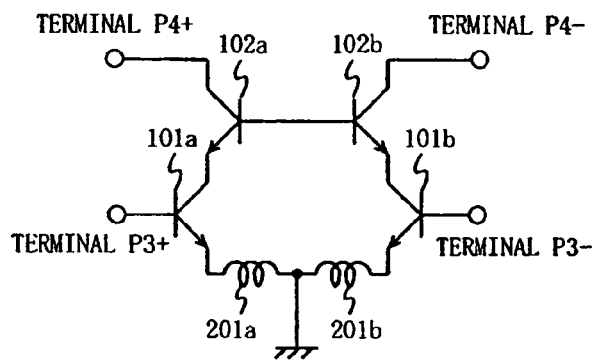
FIGS. 2A through 2F are illustrations for describing the operation of the amplifier according to the first embodiment of the present invention.
Figure 2D:
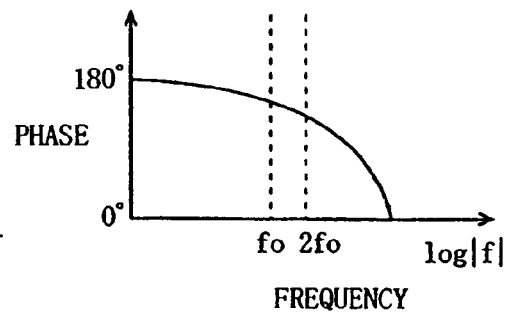

FIG. 2D is a graph showing the passing phase characteristics of the circuit illustrated in FIG. 2A. As illustrated in FIG. 2D, the passing phase from a pair of terminals {P3+, P3−} to a pair of terminals {P4+, P4−} is monotonously decreased from 180 degrees as the frequency of the input signal is increased. A ratio of decrease in the passing phase is determined by the values of the inductors 201a and 201b.

Figure 2B:
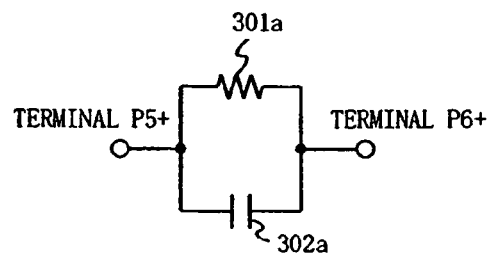
Figure 2E:
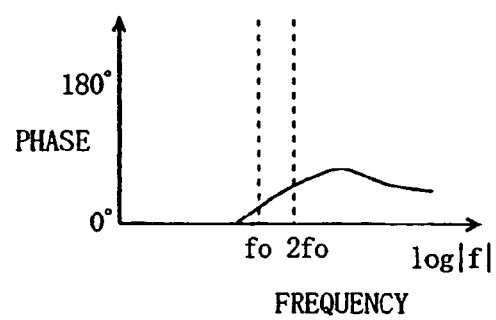

FIG. 2E is a graph showing the passing phase characteristics of the circuit illustrated in FIG. 2B. As illustrated in FIG. 2E, the passing phase from a terminal P5+ to a terminal P6+ is monotonously increased from 0 degree as the frequency of the input signal is changed from a frequency of $f_0$ of a fundamental wave to a frequency of $2f_0$ of a second harmonic. A ratio of increase in the passing phase is determined by the values of the resistance 301a and the capacitor 302a.

Figure 2C:
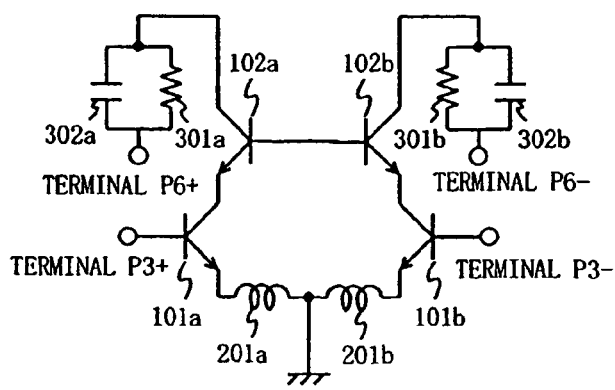
Figure 2F:
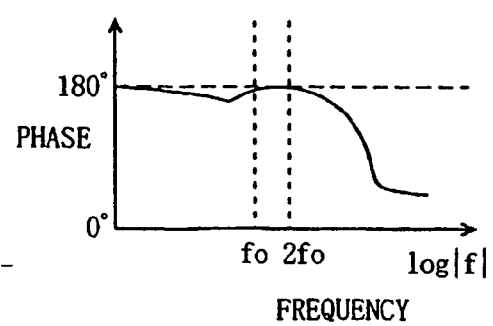

FIG. 2F is a graph showing the passing phase characteristics of the circuit illustrated in FIG. 2C. This figure is obtained by adding the characteristics illustrated in FIG. 2D and those illustrated in FIG. 2E together. As described above, as the frequency of the input signal is changed from the frequency of $f_0$ of the fundamental wave to the frequency of $2f_0$ of the second harmonic, the passing phase in the circuit of FIG. 2A is monotonously decreased, whereas the passing phase in the circuit of FIG. 2B is monotonously increased. Therefore, with appropriate selection of the values of the inductors 201a and 201b, the resistances 301a and 301b, and the capacitors 302a and 302b, the passing phase in the circuit illustrated in FIG. 2C can be made constant at approximately 180 degrees in a range including the frequency of $f_0$ of the fundamental wave and the frequency of $2f_0$ of the second harmonic, as illustrated in FIG. 2F.

Therefore, the amplifier illustrated in FIG. 1 can feed the second harmonic shifted in phase by 180 degrees back to the input. That is, the second harmonic can be negatively fed back to the input. Furthermore, the frequency of the third-order intermodulation wave is adjacent to the frequency of $f_0$ of the fundamental wave. Therefore, the amplifier of the present embodiment can feed the third-order intermodulation wave shifted in phase by 180 degrees back to the input. That is, the third-order intermodulation wave can be negatively fed back to the input.

As such, in the amplifier illustrated in FIG. 1, the passing phase of the amplifier circuit 15 is adjusted by the inductors 201a and 201b, whereas the passing phase of the feedback circuit 35 is adjusted by the resistances 301a and 301b and the capacitors 302a and 302b. With this, it is possible to negatively feed the fundamental wave, the third-order intermodulation wave, and the second harmonic of the input signal back to the input with a simple structure. Moreover, the amplifier of the present embodiment does not use a strip line or slot line, compared with the conventional amplifiers. Therefore, the amplifier can be easily integrated, even if being used in a microwave band, into a semiconductor integrated circuit.

As described above, according to the amplifier of the present embodiment, the phase controller circuit 25 and the feedback circuit 35 are used so as to appropriately adjust the phase of the feedback signal. With this, it is possible to achieve, on the entire amplifier, negative feedback of the fundamental wave, the third-order intermodulation wave, and the second harmonic of the input signal. Thus, a high-frequency negative feedback amplifier having a wide dynamic range can be achieved with a simple structure.

(Second Embodiment)

Figure 3:
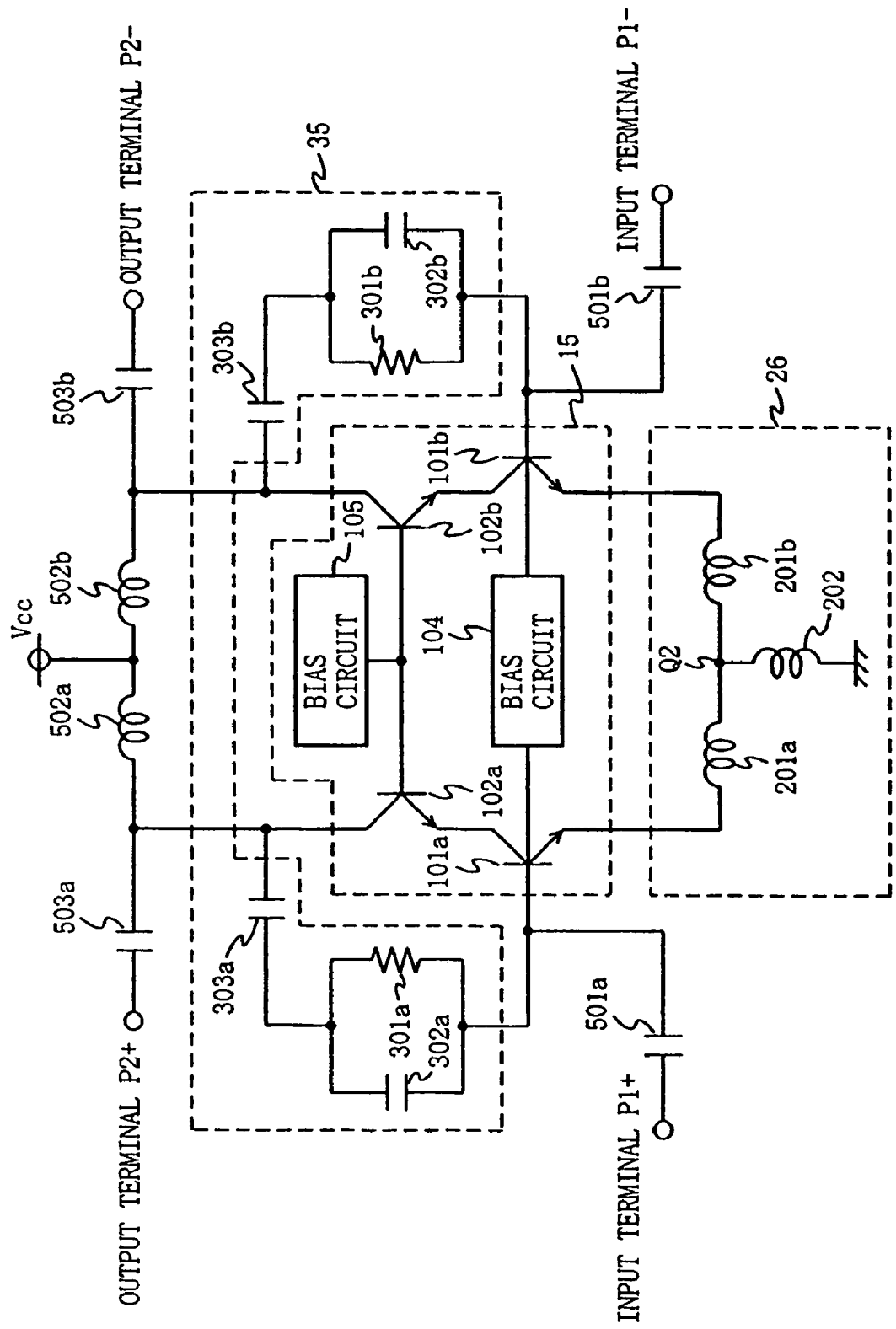
FIG. 3 is a circuit diagram of an amplifier according to a second embodiment of the present invention.

FIG. 3 is a circuit diagram of an amplifier according to a second embodiment of the present invention. The amplifier illustrated in FIG. 3 is similar to that according to the first embodiment, except that the phase controller circuit 25 is replaced by a phase controller circuit 26. Therefore, in FIG. 3, components similar to those according to the first embodiment are provided with the same reference numerals, and are not described herein.

The phase controller circuit 26 includes inductors 201a, 201b, and 202. As with the first embodiment, the emitters of the bipolar transistors 101a and 101b are connected to the inductors 201a and 201b, respectively, at one end each. At the other end each, the inductors 201a and 201b are connected to each other, and their connecting point Q2 is grounded via the inductor 202. The inductor 202 is used for adjusting the passing phase of the second harmonic of the amplifier circuit.

With reference to FIG. 4, the operation of the amplifier illustrated in FIG. 3 is described below. The phase controller circuit 26 is supplied with a differential signal. Therefore, at the connecting point Q2, two input signals are cancelled by each other. The potential at the connecting point Q2 is always 0 even through the input signals are alternating-current signals. Therefore, the passing phase of a fundamental wave component of the output signal is not influenced by the inductor 202. Here, the second harmonic component of the output signal can be represented by using an angular velocity of ω, as cos (2ωt) for a non-inverted signal and as cos {2(ωt+π)}=cos (2ωt) for an inverted signal. Therefore, it is evident that the non-inverted signal and the inverted signal are in phase. For this reason, the passing phase of the second harmonic component of the output signal is delayed by the influence of the inductor 202.

Here, as with the first embodiment, passing phase characteristics are studied below on the following three circuits: a circuit illustrated in FIG. 4A including the bipolar transistors 101a, 101b, 102a, and 102b and the inductors 201a, 201b, and 202; a circuit illustrated in FIG. 4B including the resistance 301a and the capacitor 302a; and a circuit illustrated in FIG. 4C having therein the circuit illustrated in FIG. 4A and two of the circuit illustrated in FIG. 4B being connected to one another.

Figure 4A:
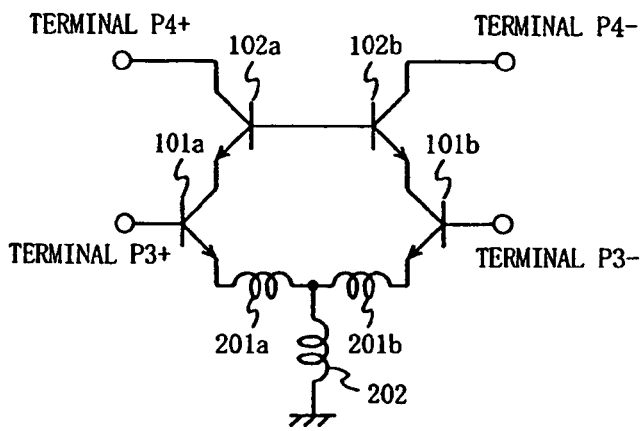
FIGS. 4A through 4F are illustrations for describing the operation of the amplifier according to the second embodiment of the present invention.
Figure 4D:
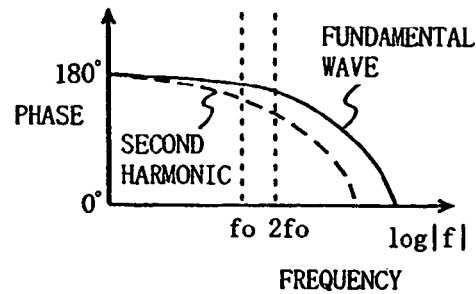

FIG. 4D is a graph showing the passing phase characteristics of the circuit illustrated in FIG. 4A. As illustrated in FIG. 4D, the passing phase from a pair of terminals {P3+, P3−} to a pair of terminals {P4+, P4−} is monotonously decreased from 180 degrees as the frequency of the input signal is increased. Moreover, the passing phase of a second harmonic component (denoted by a dotted line) is delayed in phase with respect to a fundamental wave component (denoted by a solid line). This is because the passing phase of the fundamental wave component is determined by the values of the inductors 201a and 201b, whereas the passing phase of the second harmonic component is determined by these values further in consideration of the value of the inductor 202.

Figure 4B:
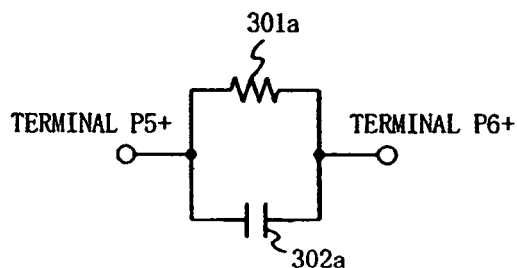
Figure 4E:
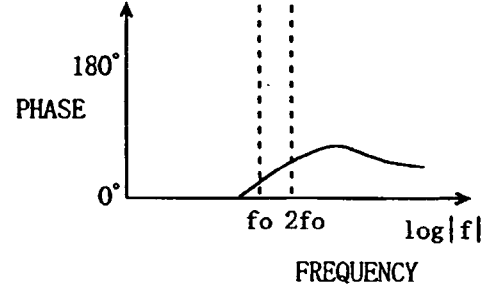

FIG. 4E is a graph showing the passing phase characteristics of the circuit illustrated in FIG. 4B. As illustrated in FIG. 4E, the passing phase from a terminal P5+ to a terminal P6+ is monotonously increased from 0 degree as the frequency of the input signal is changed from the frequency of $f_0$ of the fundamental wave to the frequency of $2f_0$ of the second harmonic.

Figure 4C:
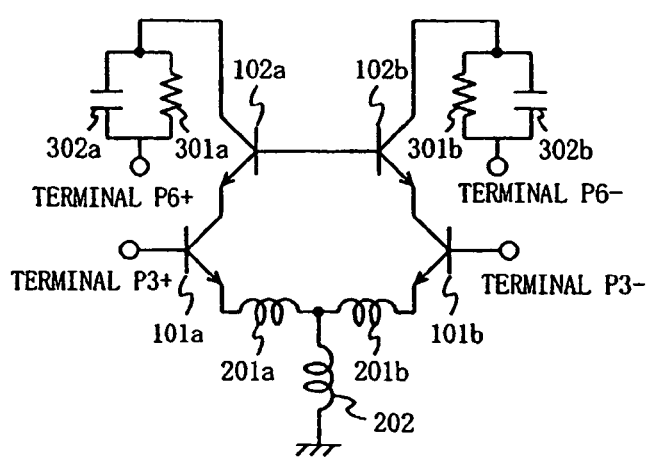
Figure 4F:
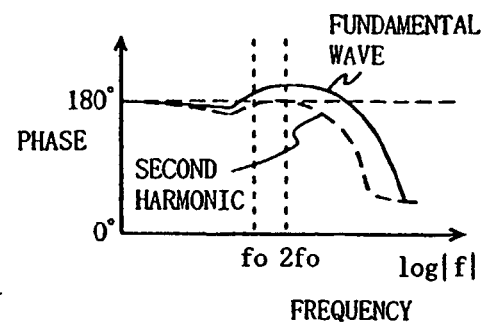

FIG. 4F is a graph showing the passing phase characteristics of the circuit illustrated in FIG. 4C. This figure is obtained by adding the characteristics illustrated in FIG. 4D and those illustrated in FIG. 4E together. As described above, as the frequency of the input signal is changed from the frequency of $f_0$ of the fundamental wave to the frequency of $2f_0$ of the second harmonic, the passing phase in the circuit of FIG. 4A is monotonously decreased, whereas the passing phase in the circuit of FIG. 4B is monotonously increased. Therefore, with appropriate selection of the values of the inductors 201a, 201b, and 202, the resistances 301a and 301b, and the capacitors 302a and 302b, the passing phase in the circuit illustrated in FIG. 4C can be made constant at approximately 180 degrees in a range including the frequency of $f_0$ of the fundamental wave and the frequency of $2f_0$ of the second harmonic, as illustrated in FIG. 4F.

Therefore, as with the amplifier according to the first embodiment, the amplifier illustrated in FIG. 3 can negatively feed the second harmonic back to the input. Furthermore, the frequency of the third-order intermodulation wave is adjacent to the frequency of $f_0$ of the fundamental wave. Therefore, the amplifier of the present embodiment can negatively feed the third-order intermodulation wave back to the input.

As such, in the amplifier illustrated in FIG. 3, the passing phase of the amplifier circuit 15 is adjusted by the inductors 201a, 201b, and 202, whereas the passing phase of the feedback circuit 35 is adjusted by the resistances 301a and 301b and the capacitors 302a and 302b. With this, it is possible to negatively feed the fundamental wave, the third-order intermodulation wave, and the second harmonic of the input signal back to the input with a simple structure.

Moreover, compared with the amplifier according to the first embodiment, the amplifier according to the second embodiment further includes the inductor 202 for separately adjusting the second harmonic component. With this, it is possible to separately adjust the passing phase of each of the fundamental wave, the third-order intermodulation wave, and the second harmonic of the input signal with a simple structure. Therefore, it is possible, for example to select the values of the inductors 201a and 201b in advance so that other high-frequency characteristics, such as noise characteristics, are optimal, and then select the value of the inductor 202.

As described above, according to the amplifier of the present embodiment, with the inductor 202 being provided, a high-frequency negative feedback amplifier having a wide dynamic range can be achieved with more flexibility than that of the amplifier of the first embodiment.

(Third Embodiment)

Figure 5:
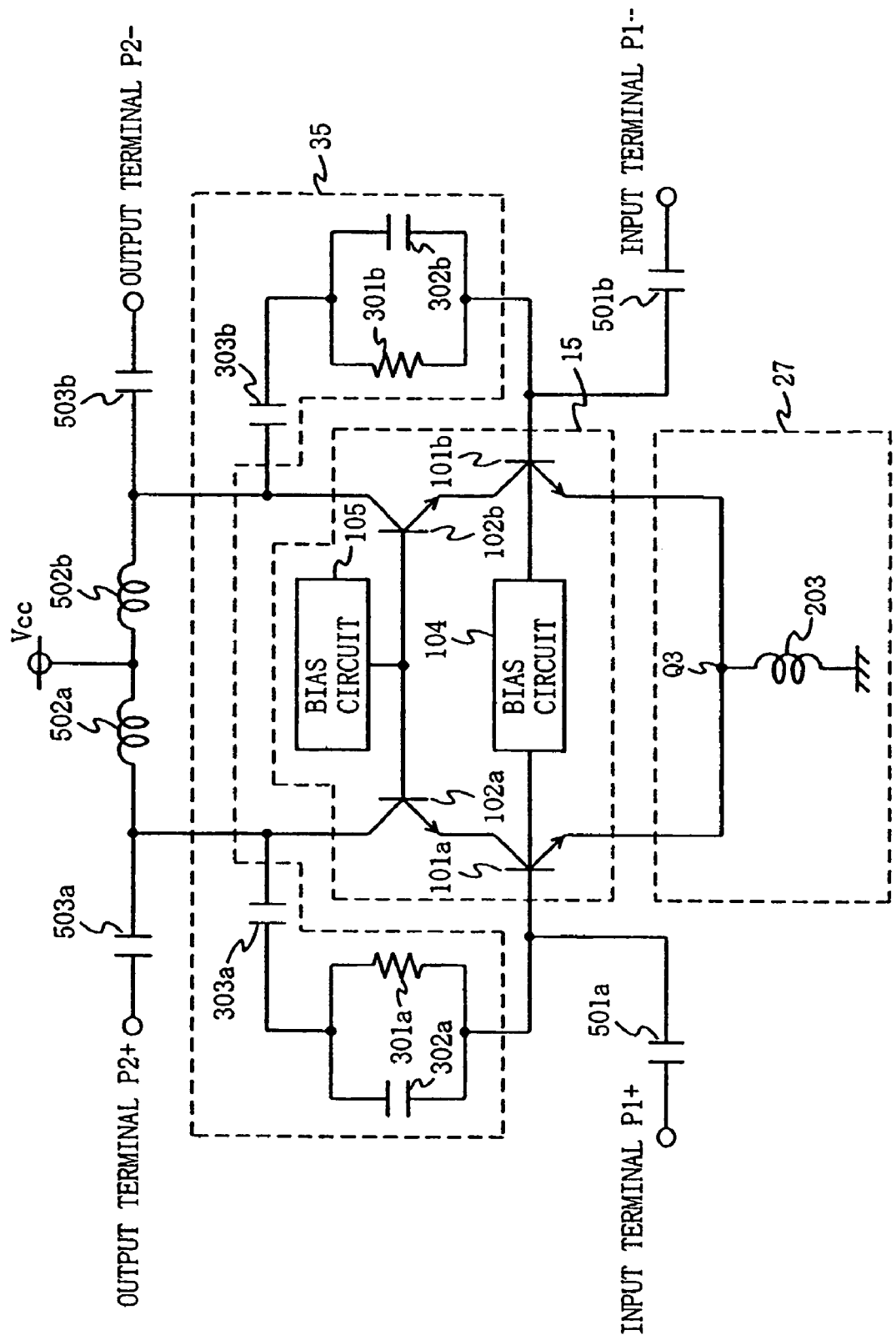
FIG. 5 is a circuit diagram of an amplifier according to a third embodiment of the present invention.

FIG. 5 is a circuit diagram of an amplifier according to a third embodiment of the present invention. The amplifier illustrated in FIG. 5 is similar to that according to the first embodiment, except that the phase controller circuit 25 is replaced by a phase controller circuit 27. Therefore, in FIG. 5, components similar to those according to the first embodiment are provided with the same reference numerals, and are not described herein.

The phase controller circuit 27 includes an inductor 203. Unlike the first embodiment, the emitters of the bipolar transistors 101a and 101b are directly connected to each other, and their connecting point Q3 is grounded via the inductor 203. The inductor 203 is used for adjusting the passing phase of the second harmonic of the amplifier circuit.

In the amplifier illustrated in FIG. 5, the operations of the resistances 301a and 301b and the capacitors 302a and 302b cause the fundamental wave shifted in phase by 180 degrees to be fed back to the input. That is, the fundamental wave can be negatively fed back to the input. Also in this amplifier, the operation of the inductor 203 causes the second harmonic shifted in phase by 180 degrees to be fed back to the input. That is, the second harmonic can be negatively fed back. Moreover, the frequency of the third-order intermodulation wave is adjacent to the frequency of $f_0$ of the fundamental wave. Therefore, the amplifier can feed the third-order intermodulation wave shifted in phase by 180 degrees back to the input. That is, the third-order intermodulation wave can be negatively fed back to the input.

As such, in the amplifier illustrated in FIG. 5, the passing phase of the amplifier circuit 15 is adjusted by the inductor 203, whereas the passing phase of the feedback circuit 35 is adjusted by the resistances 301a and 301b and the capacitor 302a and 302b. Therefore, it is possible to achieve negative feedback of the fundamental wave, the third-order intermodulation wave, and the second harmonic of the input signal to the input with a simple structure.

Generally speaking, in a differential amplifier circuit, it is preferable that the characteristics (DC and AC characteristics) of differential circuits as a pair in the differential amplifier circuit are close to each other, that is, these two differential circuits form a good pair. In the amplifiers according to the first and second embodiments, however, with the use of the inductors 201a and 201b, the differential circuits do not always form a good pair due to variations in stray capacitance, parasitic resistance, etc. By contrast, in the amplifier illustrated in FIG. 5, the inductors 201a and 201b are not used. Therefore, it is possible to achieve an effect that the differential circuits can keep forming a good pair.

As described above, according to the amplifier of the present embodiment, with the inductors 201a and 201 not being provided, it is possible to achieve a high-frequency negative feedback amplifier having a wide dynamic range while the differential circuits in the differential amplifier circuit keep forming a good pair.

(Fourth Embodiment)

Figure 6:
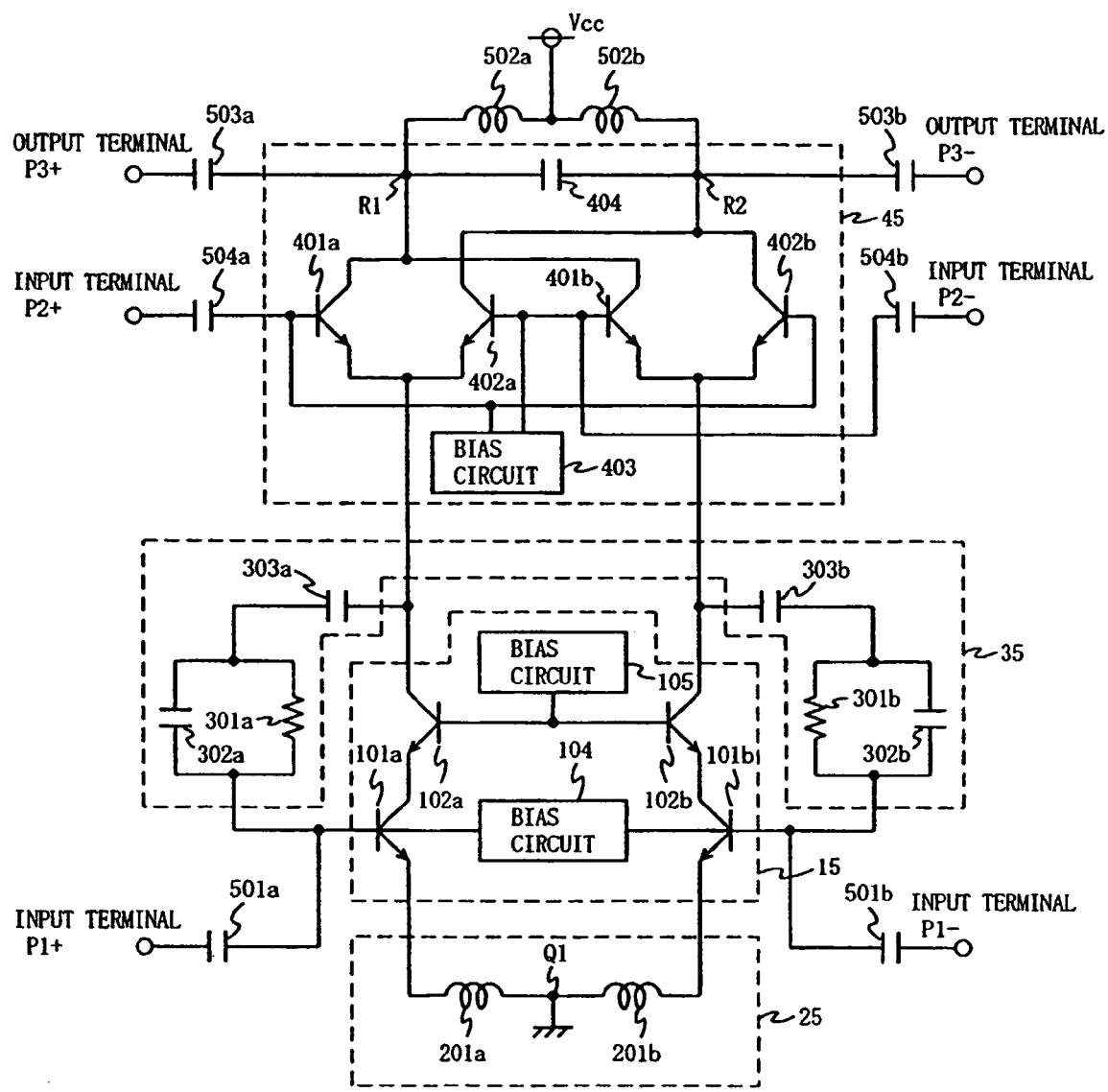
FIG. 6 is a circuit diagram of a frequency converter according to a fourth embodiment of the present invention.

FIG. 6 is a circuit diagram of a frequency converter according to a fourth embodiment of the present invention. The frequency converter illustrated in FIG. 6 includes an amplifier circuit 15, a phase controller circuit 25, a feedback circuit 35, a frequency converter circuit 45, DC cut capacitors 501a, 501b, 503a, 503b, 504a, and 504b, and choke inductors 502a and 502b. This frequency converter is structured by adding the frequency converter circuit 45 to the amplifier according to the first embodiment. In this frequency converter, the frequency converter circuit 45 is structured by a differential pair, along with the amplifier circuit 15, the phase controller circuit 25, and the feedback circuit 35. In FIG. 5, components similar to those according to the first embodiment are provided with the same reference numerals, and are not described herein.

The frequency converter circuit 45 includes bipolar transistors 401a, 401b, 402a, and 402b, a bias circuit 403, and a capacitor 404, thereby converting the frequency of a signal supplied by the amplifier circuit 15.

In the frequency converter illustrated in FIG. 6, the input terminal P1+ is connected via the DC cut capacitor 501a to the base of the bipolar transistor 101a, whereas the input terminal P1− is connected via the DC cut capacitor 501b to the base of the bipolar transistor 101b. The collectors of the bipolar transistors 101a and 101b are connected to the emitters of the bipolar transistors 102a and 102b, respectively. The collector of the bipolar transistor 102a is connected to both of the emitters of the bipolar transistors 401a and 402a. The collector of the bipolar transistor 102b is connected to both of the emitters of the bipolar transistors 401b and 402b. The collectors of the bipolar transistors 401a and 401b are connected at a connecting point R1, whereas the collectors of the bipolar transistors 402a and 402b are connected at a connecting point R2. The connecting point R1 is connected via the DC cut capacitor 503a to an output terminal P3+, whereas the connecting point R2 is connected via the DC cut capacitor 503b to an output terminal P3−. The emitters of the bipolar transistors 101a and 101b serve as phase-adjusting terminals of the amplifier circuit 15, and are connected to the inductors 201a and 201b, respectively, at one end each. At the other end each, the inductors 201a and 201b are connected to each other, and their connecting point Q1 is grounded. The base of each of the bipolar transistors 101a and 101b is supplied with a base current from the bias circuit 104. The base of each of the bipolar transistors 102a and 102b is supplied with a base current from the bias circuit 105. The base of each of the bipolar transistors 401a, 401b, 402a, and 402b is supplied with a base current from the bias circuit 403.

The resistance 301a and the capacitor 302a are connected to each other in parallel so as to form a parallel circuit. This parallel circuit and the DC cut capacitor 303a are inserted in series between the base of the bipolar transistor 101a and the collector of the bipolar transistor 102a. The resistance 301b and the capacitor 302b are connected to each other in parallel so as to form a parallel circuit. This parallel circuit and the DC cut capacitor 303b are inserted in series between the base of the bipolar transistor 101b and the collector of the bipolar transistor 102b. The power voltage Vcc is supplied via the choke inductor 502a to the connecting point R1, and via the choke inductor 502b to the connecting point R2.

An input terminal P2+ is connected via the DC cut capacitor 504a to the base of each of the bipolar transistors 401a and 402b. An input terminal P2− is connected via the DC cut capacitor 504b to the base of each of the bipolar transistors 401b and 402a. The capacitor 404 is inserted between the connecting points R1 and R2 for reducing a leak of the second harmonic of a local signal to the output terminals P3+ and P3−.

In normal use, the pair of input terminals {P1+, P1−} is supplied with an RF (Radio Frequency) signal received by an antenna and then amplified by a low-noise amplifier. The input terminals P2+ and P2− are supplied with a LO (Local Oscillator) signal supplied by a local oscillator. Output from the output terminals P3+ and P3− is an IF (Intermediate Frequency) signal mainly including a signal of an intermediate frequency.

As with the amplifier according to the first embodiment, the frequency converter illustrated in FIG. 6 can feed back the fundamental signal and the second harmonic that have been shifted in phase by 180 degrees of the RF signal supplied by the pair of input terminals {P1+, P1−}. That is, the fundamental signal and the second harmonic can be negatively fed back to the input. Moreover, the frequency of the third-order intermodulation wave is adjacent to the frequency of $f_0$ of the fundamental wave. Therefore, the frequency converter can feed the third-order intermodulation wave shifted in phase by 180 degrees back to the input. That is, the third-order intermodulation wave can be negatively fed back to the input.

As such, in the frequency converter illustrated in FIG. 6, the passing phase of the amplifier circuit 15 is adjusted by the inductors 201a and 201b, whereas the passing phase of the feedback circuit 35 is adjusted by the resistances 301a and 301b and the capacitors 302a and 302b. Therefore, it is possible to achieve negative feedback of the fundamental wave, the third-order intermodulation wave, and the second harmonic of the input signal to the input with a simple structure. Moreover, the frequency converter of the present embodiment does not use a strip line or slot line, compared with conventional frequency converters. Therefore, the frequency converter can be easily integrated, even if being used in a microwave band, into a semiconductor integrated circuit.

Furthermore, conventional frequency converters have a drawback in which the second harmonic of the LO signal occurring at the frequency converter circuit affects the operation of the amplifier circuit. By contrast, in the frequency converter illustrated in FIG. 6, the phase controller circuit 25 is adjusted so that the second harmonic of the LO signal occurring at the frequency converter circuit 45 is shifted in phase by the feedback circuit 35 and the amplifier circuit 15 for output to the frequency converter circuit 45. As a result, it is possible to reduce the level of the second harmonic of the LO signal occurring at the frequency converter circuit 45.

As described above, according to the frequency converter of the present embodiment, the phase controller circuit 25 and the feedback circuit 35 are used to appropriately adjust the phase of the feedback signal, thereby achieving, on the entire frequency converter, negative feedback of the fundamental wave, the third-order intermodulation wave, and the second harmonic of the input signal. Therefore, it is possible to achieve a high-frequency negative feedback frequency converter having a wide dynamic range.

(Fifth Embodiment)

Figure 7:
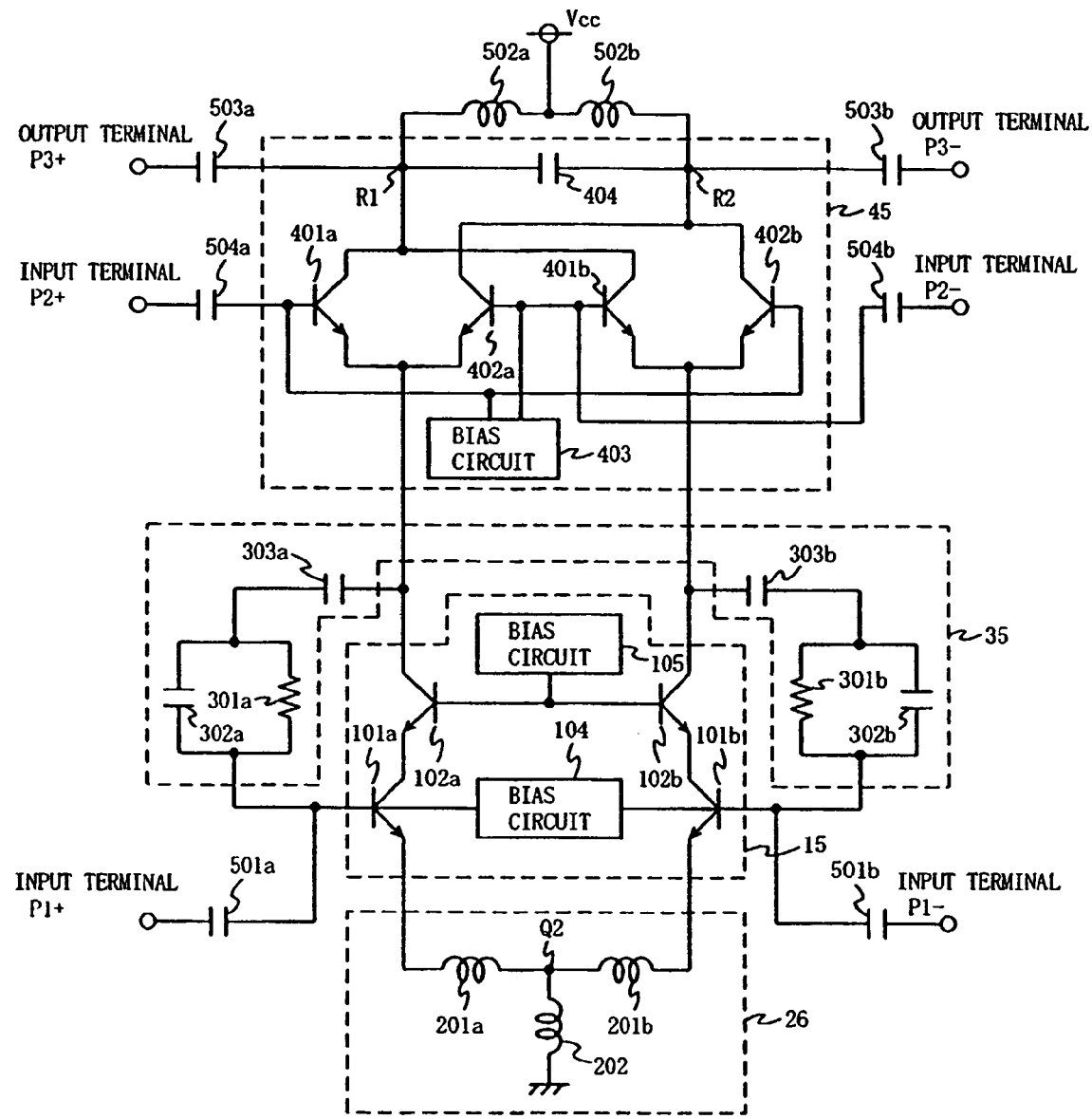
FIG. 7 is a circuit diagram of a frequency converter according to a fifth embodiment of the present invention.

FIG. 7 is a circuit diagram of a frequency converter according to a fifth embodiment of the present invention. The frequency converter illustrated in FIG. 7 is similar to that according to the fourth embodiment, except that the phase controller circuit 25 is replaced by a phase controller circuit 26.

The structure and effect of the frequency converter illustrated in FIG. 7 are evident from the above descriptions of the amplifier according to the second embodiment and the frequency converter according to the fourth embodiment, and therefore are not described herein.

According to the frequency converter of the present embodiment, with the inductor 202 being provided, a high-frequency negative feedback frequency converter having a wide dynamic range can be achieved with more flexibility than that of the fourth embodiment.

(Sixth Embodiment)

Figure 8:
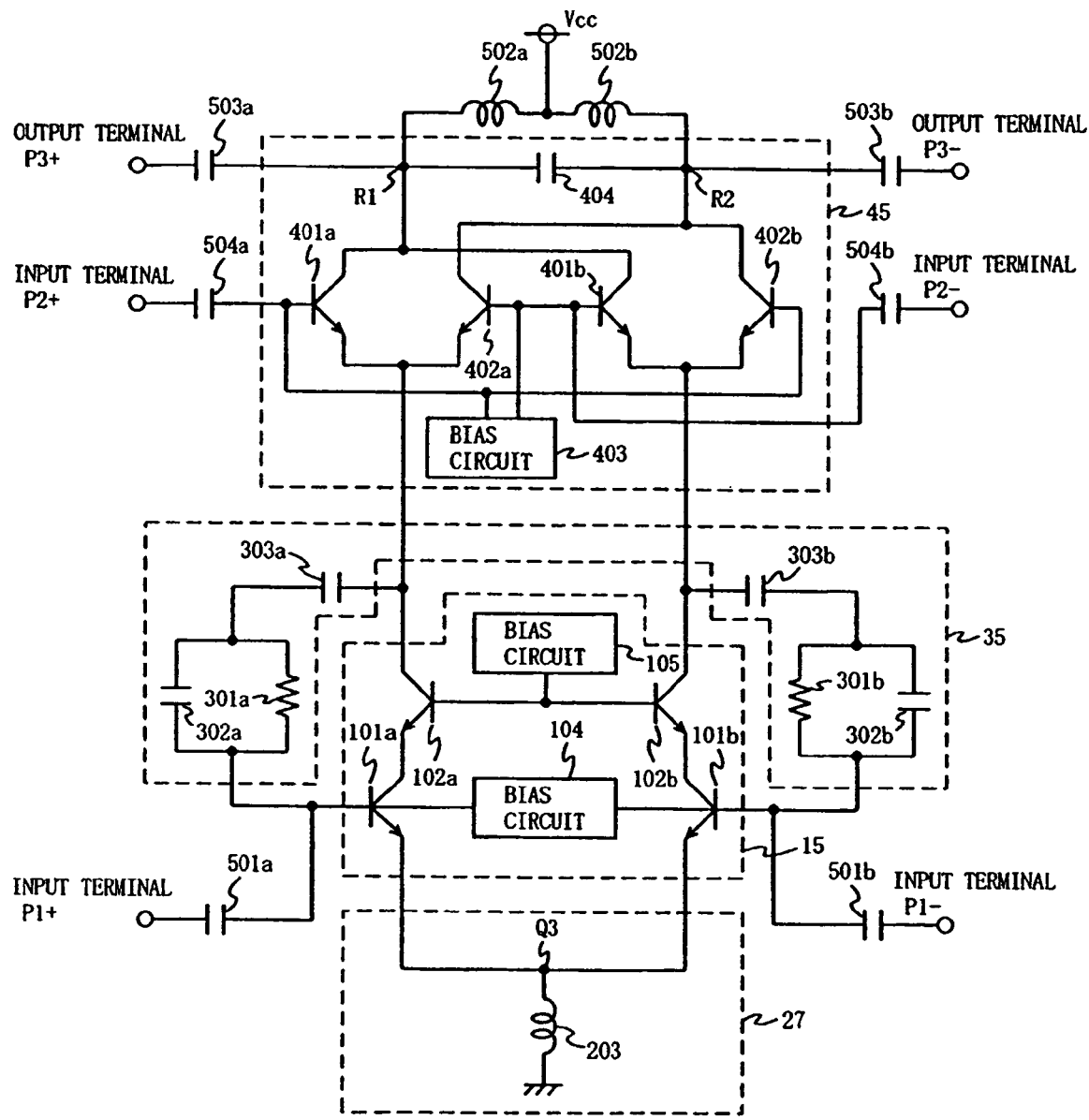
FIG. 8 is a circuit diagram of a frequency converter according to a sixth embodiment of the present invention.

FIG. 8 is a circuit diagram of a frequency converter according to a sixth embodiment of the present invention. The frequency converter illustrated in FIG. 8 is similar to that according to the fourth embodiment, except that the phase controller circuit 25 is replaced by a phase controller circuit 27.

The structure and effect of the frequency converter illustrated in FIG. 8 are evident from the above descriptions of the amplifier according to the third embodiment and the frequency converter according to the fourth embodiment, and therefore are not described herein.

According to the frequency converter of the present embodiment, with the inductors 201a and 201b not being provided, a high-frequency negative feedback frequency converter having a wide dynamic range can be achieved while the differential circuits of the differential amplifier circuit keep forming a good pair.

(Modifications of Embodiments)

Exemplary modifications of the amplifiers according to the first through third embodiments and the frequency converters according to the fourth through sixth embodiments are described below. The amplifiers and the frequency converters described below have effects similar to those of the amplifiers and converters that have been described above.

First, the feedback circuit 35 shown in each embodiment can be replaced by another feedback circuit. For example, such a feedback circuit can be formed by using two circuits of any one of three types illustrated in FIGS. 9A through 9C as a pair. A circuit 310 illustrated in FIG. 9A includes a resistance 311 and capacitors 312 and 313. The resistance 311 and the capacitor 312 are connected to each other in series to form a series circuit, to which the capacitor 313 is connected in parallel. A circuit 320 illustrated in FIG. 9B includes capacitors 321 and 322, and a resistance 323. The capacitors 321 and 322 are connected to each other in series, and their connecting point S1 is grounded via the resistance 323. A circuit 330 illustrated in FIG. 9C includes capacitors 331 and 332, and an inductor 333. The capacitors 331 and 332 are connected in series, and their connecting point S2 is grounded via the inductor 333.

Figure 9A:
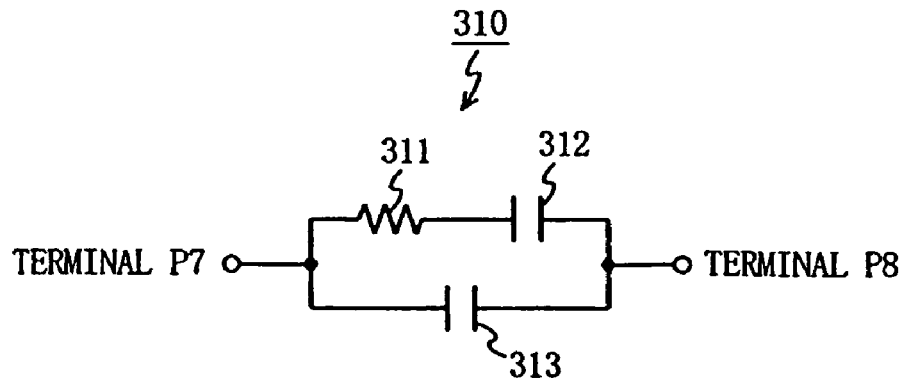
FIGS. 9A through 9C are illustrations of other circuits included in a feedback circuit according to the first through sixth embodiments of the present invention.
Figure 9B:
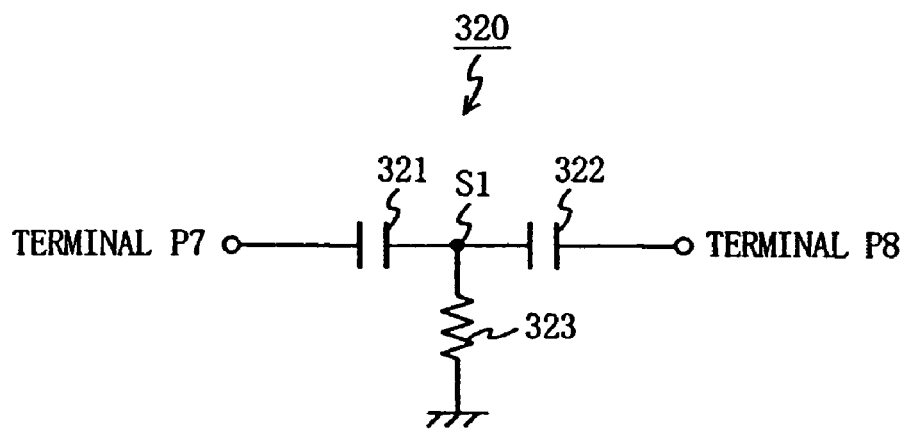
Figure 9C:
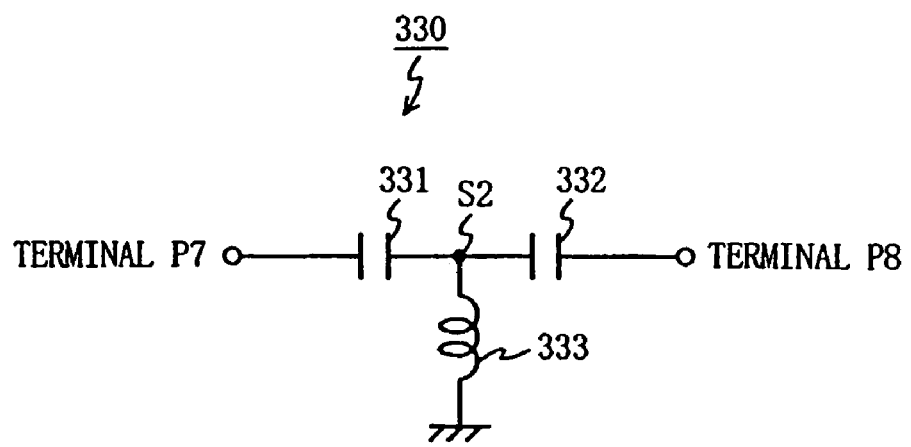

Consider a case where any of the circuits illustrated in FIGS. 9A through 9C is used to form the feedback circuit of the amplifier according to the first embodiment. In this case, first and second circuits are formed by using the same type of circuits. Here, the first circuit has a terminal P7 that is connected to the base of the bipolar transistor 101a. The first circuit also has a terminal P8 that is connected to the collector of the bipolar transistor 102a. The second circuit has a terminal P7 that is connected to the base of the bipolar transistor 101b. The second circuit also has a terminal P8 that is connected to the collector of the bipolar transistor 102b. The same goes for cases in which any of the circuits illustrated in FIGS. 9A through 9C is used to form the feedback circuit of the amplifier according to the embodiments other than the first embodiment.

Figure 10:
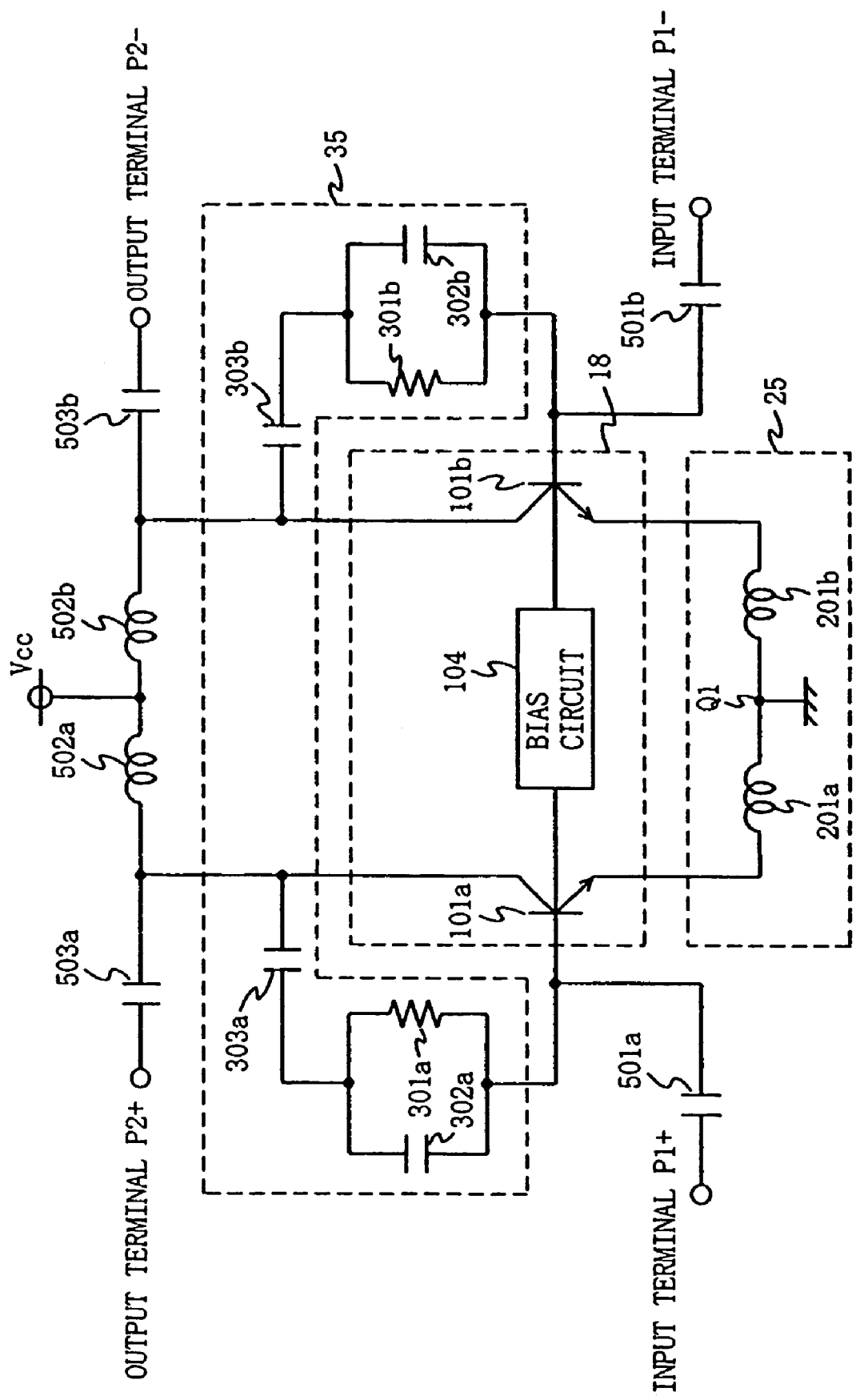
FIG. 10 is a circuit diagram of an amplifier according to an example modification of the first embodiment of the present invention.

Also, instead of the cascode amplifier circuit 15 in each embodiment, an amplifier circuit having another structure can be used. For example, a single-type amplifier circuit (refer to FIG. 10) can be used. In an amplifier illustrated in FIG. 10, an amplifier circuit 18 includes bipolar transistors 101a and 101b, and a bias circuit 104. The collectors of the bipolar transistors 101a and 101b are connected via the DC cut capacitors 503a and 503b to the pair of output terminals {P2+, P2−}, respectively. Other than the structure of the amplifier circuit as mentioned above, the amplifier of FIG. 10 is similar to that of FIG. 1. With the use of such a single-type amplifier circuit, an amplifier having low noise characteristics can be achieved. The above same effects can be also achieved by applying a single-type amplifier circuit to the amplifiers and the frequency converters of other embodiments.

Furthermore, the bipolar transistors shown in each embodiment can be replaced by heterojunction bipolar transistors made of SiGe/Si, AlGaAs/GaAs, or GaInP/GaAs. Thus, it is possible to achieve an amplifier and a frequency converter having low noise and low distortion characteristics in high frequencies. Also, the bipolar transistors can be replaced by MOSFETs. Thus, with the use of low-cost CMOS process, it is possible to manufacture the amplifiers and the frequency converters according to the embodiments at low cost. Note that such replaceable bipolar transistors are those provided with reference numerals of 101a, 101b, 102a, and 102b shown in FIGS. 1, 3, and 5 and 101a, 101b, 102a, 102b, 401a, 401b, 402a, and 402b shown in FIGS. 6, 7, and 8.

Figure 11A:
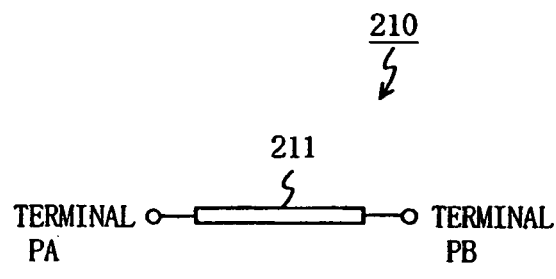
FIGS. 11A through 11F are illustrations of other circuits included in a phase controller circuit according to the first through sixth embodiments of the present invention.
Figure 11B:
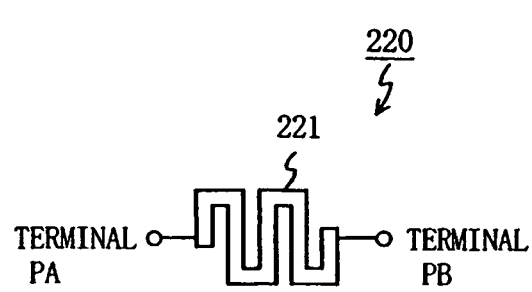
Figure 11C:
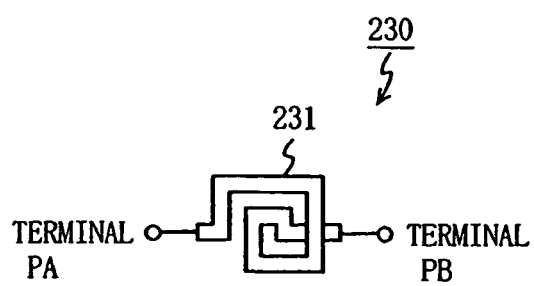
Figure 11D:
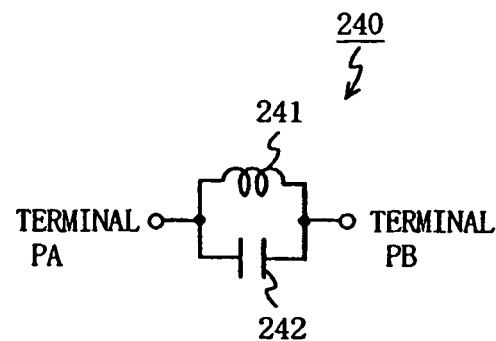
Figure 11E:
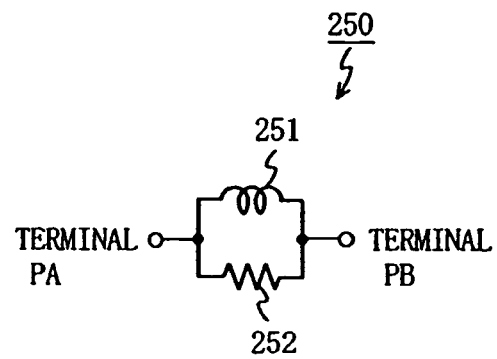
Figure 11F:
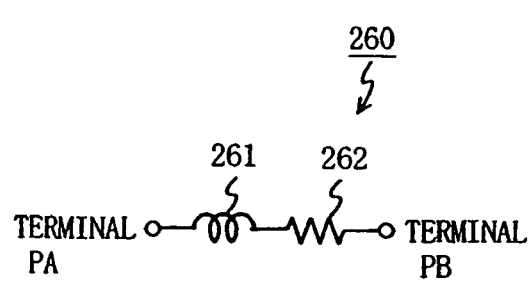
Figure 12:
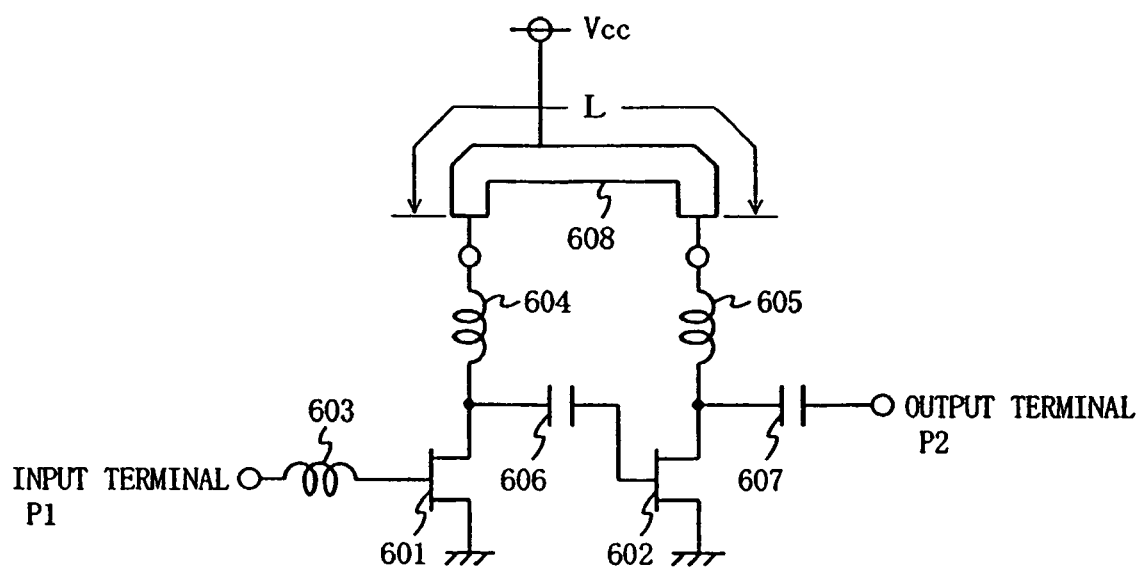
FIG. 12 is an illustration of a negative feedback amplifier according to a first conventional example.
Figure 13:
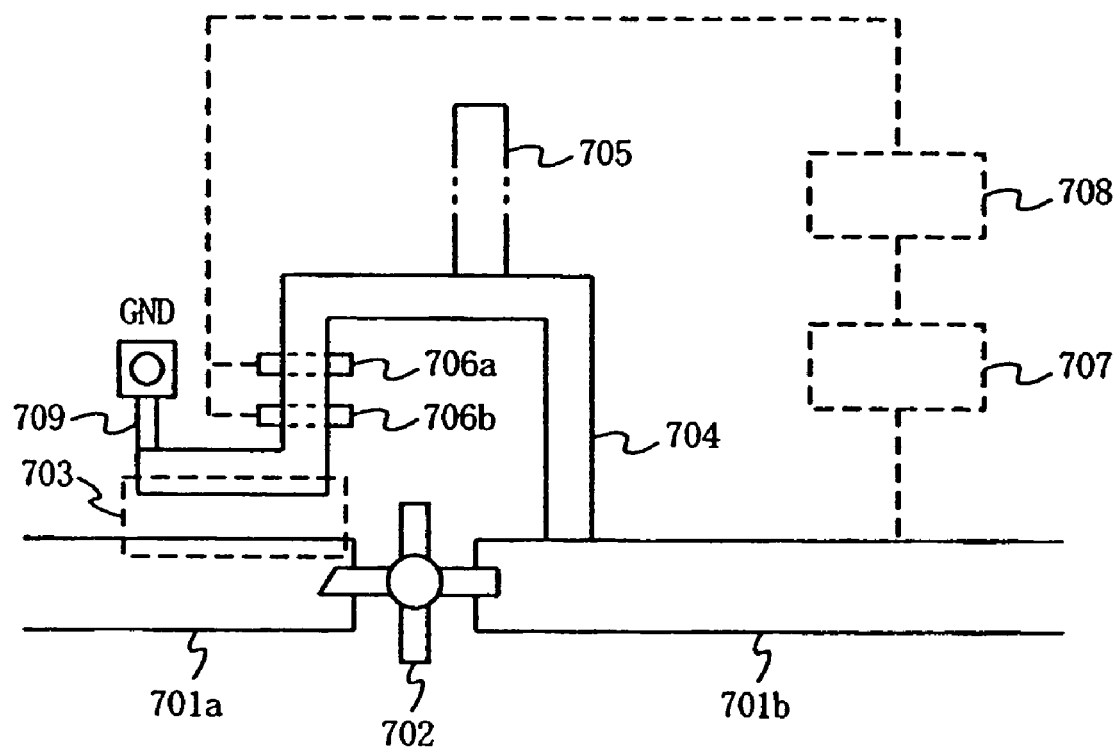
FIG. 13 is an illustration of a negative feedback amplifier according to a second conventional example.
Figure 14:
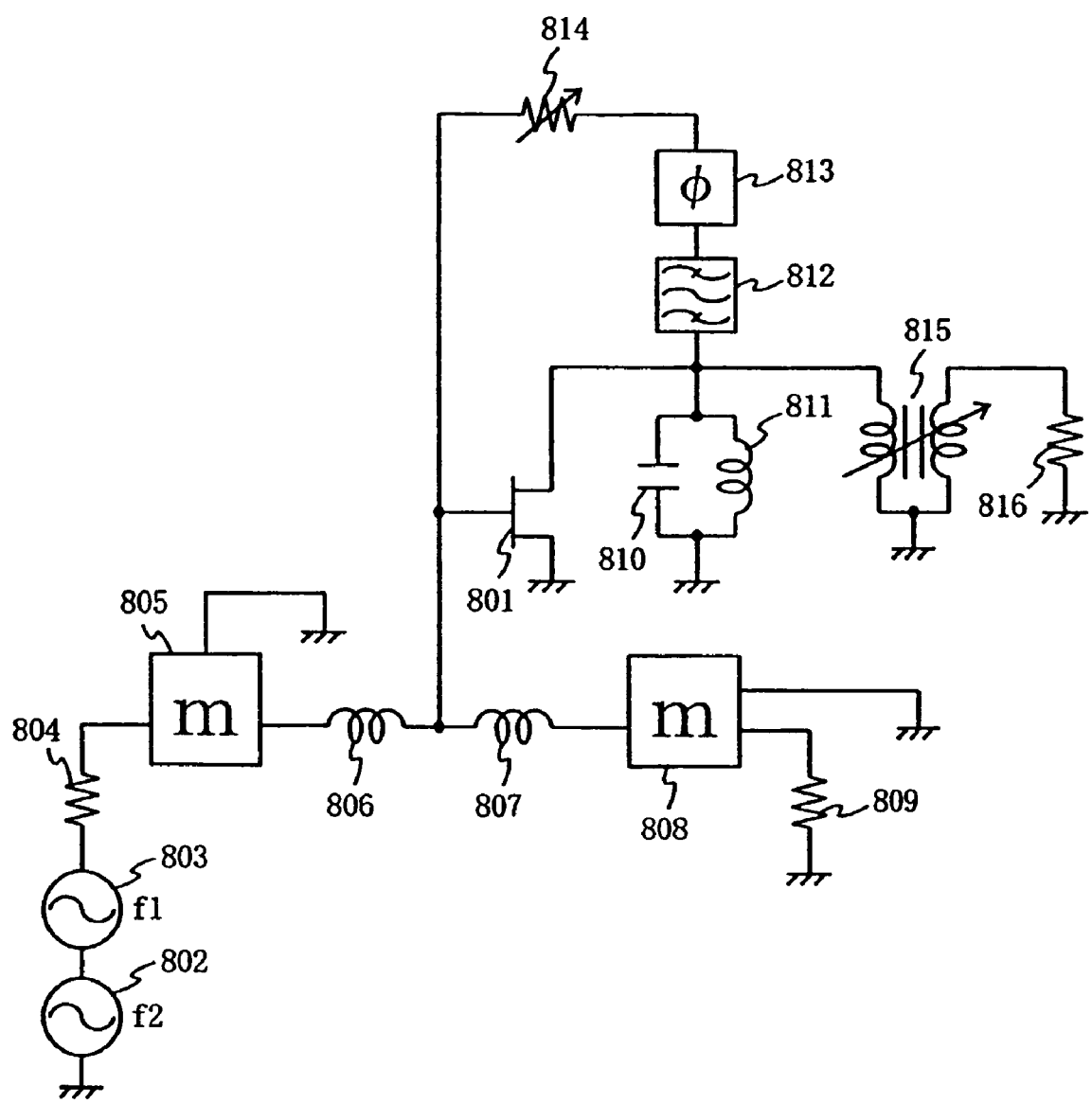
FIG. 14 is an illustration of a negative feedback amplifier according to a third conventional example.
Figure 15:
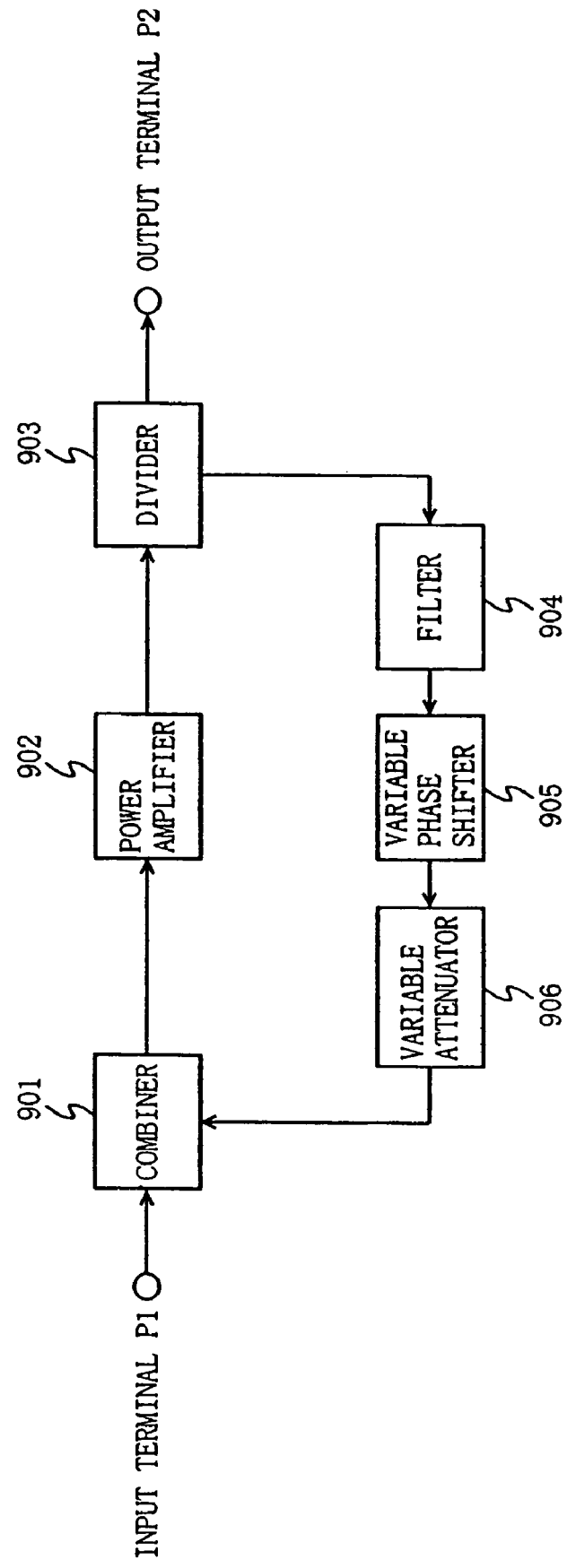
FIG. 15 is an illustration of a negative feedback amplifier according to a fourth conventional example.
Figure 16:
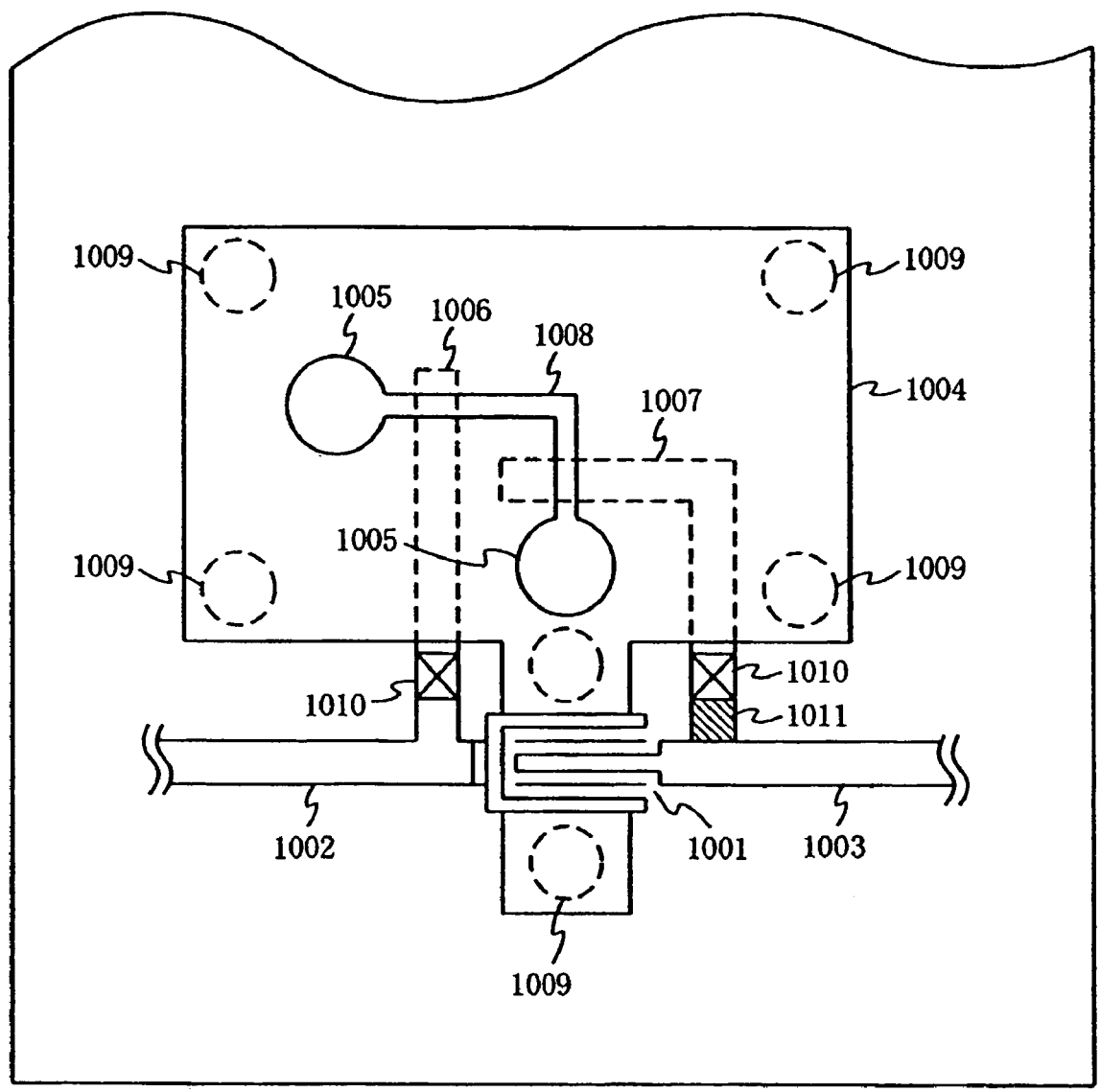
FIG. 16 is an illustration of a negative feedback amplifier according to a fifth conventional example.

Still further, in the above embodiments, the phase controller circuits 25, 26, and 27 are implemented by inductors. Alternatively, other circuit can be used. For example, any of six types of circuits illustrated in FIGS. 11A through 11F can be used for implementing the phase controller circuit. A circuit 210 illustrated in FIG. 11A includes a linear strip line 211. A circuit 220 illustrated in FIG. 11B includes a zigzag strip line 221. A circuit 230 illustrated in FIG. 11C includes a spiral strip line 231. A circuit 240 illustrated in FIG. 11D includes an inductor 241 and a capacitor 242, which are connected to each other in parallel. A circuit 250 illustrated in FIG. 11E includes an inductor 251 and a resistance 252, which are connected to each other in parallel. A circuit 260 illustrated in FIG. 11F includes an inductor 261 and a resistance 262, which are connected in series.

Consider a case where any of the circuits illustrated in FIGS. 11A through 11F are used to implement the phase controller circuit of the amplifier according to the first embodiment. In this case, a first circuit for use in place of the inductor 201a and a second circuit for use in place of the inductor 201b are implemented by circuits of the same type. For the purpose of forming the phase controller circuit of the amplifier according to the second embodiment, circuits of the same type are used as a first circuit in place of the inductor 201a and a second circuit in place of the inductor 201b. However, a third circuit in place of the inductor 202 can be implemented by a circuit of a type that is identical to or different from that of those implementing the first and second circuits. Further, for the purpose of forming the phase controller circuit of the amplifier according to third embodiment, a circuit for use in place of the inductor 203 can be arbitrarily selected from the circuits illustrated in FIGS. 11A through 11F. With the use of the circuits including a plurality of devices (the circuits 240, 250, and 260, for example) so as to form the phase controller circuit, a phase control over the fundamental wave and the second harmonic can be more flexibly performed.

In the above embodiments, it is preferable to implement the resistances by polysilicon, the capacitors by MOS capacitors or MIM (Metal Insulator Metal) capacitors, and the inductors by wiring layers of aluminium, copper, or gold. With this, the amplifiers and the frequency converters according to the above embodiments can be easily integrated into a semiconductor integrated circuit. Note that such resistances preferably implemented by polysilicon are those provided with 301a and 301b in FIGS. 1, 3, 5, 6, 7, and 8. Also, such resistances preferably implemented by MOS capacitors or the like are those provided with reference numerals of 302a, 302b, 303a, and 303b in FIGS. 1, 3, and 5, and 302a, 302b, 303a, 303b, and 404 in FIGS. 6, 7, and 8. Furthermore, such inductors preferably implemented by wiring layers are those provided with reference numerals of 201a and 201b in FIGS. 1 and 6; 201a, 201b, and 202 in FIGS. 3 and 7; and 203 in FIGS. 5 and 8.

Still further, the phase of the feedback signal in the amplifiers and the frequency converters according to the above embodiments is influenced by an impedance of the signal source side seen from the device and an impedance of the load side seen from the device. Therefore, when a matching circuit is used at the input or output of the amplifiers and the frequency converters according to the above embodiments, the phase controller circuit and the feedback circuit have to be designed, in consideration of the impedance of the matching circuit, so that a phase difference between the input signal and the feedback signal of each of the fundamental wave and the second harmonic is 180 degrees.

As described in the foregoing, according to the amplifiers of the first through third embodiments, the frequency converters of the fourth through sixth embodiments, and the exemplary modifications of the above embodiments, the passing phase of the amplifier circuit and the passing phase of the feedback circuit are both adjusted. With this adjustment, the fundamental wave, the third-order intermodulation wave, and the second harmonic of the input signal can be negatively fed back to the input on the whole amplifier and converter. Therefore, it is possible to achieve a high-frequency negative feedback amplifier and a high-frequency negative feedback frequency converter each having a wide dynamic range with a simple structure.

INDUSTRIAL APPLICABILITY

As described above, the amplifier and the frequency converter according to the present invention can negatively feed the fundamental wave, the third-order intermodulation wave, and the second harmonic of the input signal back to the input. Therefore, the amplifier and the frequency converter each have a wide dynamic range, and are also suitable for integration into a semiconductor integrated circuit.

The invention claimed is:

1. An amplifier device for amplifying a differential signal composed of an in-phase signal and an opposite-phase signal, the amplifier device comprising:
    an amplifier circuit, located on a path from an input terminal of the amplifier device to an output terminal of the amplifier device, for amplifying the differential signal input via the input terminal of the amplifier device, the amplifier circuit having a plurality of adjusting terminals;
    a feedback circuit, located across an input of the amplifier circuit and an output of the amplifier circuit and including a parallel circuit formed by a resistor and a capacitor connected to each other in parallel, for feeding the output of the amplifier circuit back to the input of the amplifier circuit while changing a phase of the differential signal passing through the feedback circuit; and
    a phase controller circuit, located between the adjusting terminals of the amplifier circuit and ground, for changing the phase of the differential signal passing through the amplifier circuit, wherein
    the amplifier circuit includes an in-phase amplifying section having an in-phase adjusting terminal, which is one of the adjusting terminals, and operating based on the in-phase signal of the differential signal, and an opposite-phase amplifying section having an opposite-phase adjusting terminal, which is another one of the adjusting terminals, and operating based on the opposite-phase signal of the differential signal, and
    the feedback circuit includes an in-phase feedback section that operates based on the in-phase signal and an opposite-phase feedback section that operates based on the opposite-phase signal.

2. The amplifier device according to claim 1, wherein a sum of a phase change amount in the feedback circuit and a phase change amount in the amplifier circuit is approximately 180 degrees at least in a range from a frequency of a fundamental wave of the differential signal supplied by the input terminal of the amplifier device to a frequency of a second harmonic of the differential signal.

3. The amplifier device according to claim 1, wherein the phase controller circuit includes first, second and third phase adjusting sections each having two ends, one of the two ends of each of the first, second and third phase adjusting sections being commonly connected to a single connecting point,
    another end of the first phase adjusting section is connected to the in-phase adjusting terminal,
    another end of the second phase adjusting section is connected to the opposite-phase adjusting terminal, and
    another end of the third phase adjusting section is grounded.

4. The amplifier device according to claim 1, wherein the in-phase adjusting terminal and the opposite-phase adjusting terminal are directly connected to each other, and
    the phase controller circuit includes a phase adjusting section having two ends, one of the two ends being connected to the in-phase adjusting terminal and the opposite-phase adjusting terminal and another end being grounded.

5. A frequency converter for amplifying a differential signal composed of an in-phase signal and an opposite-phase signal, and converting a frequency of the amplified differential signal for output, the frequency converter comprising:
    an amplifier circuit, located on a path from an input terminal of the frequency converter to an output terminal of the frequency converter, for amplifying the differential signal input via the input terminal of the frequency converter, the amplifier circuit having a plurality of adjusting terminals;
    a frequency converter circuit for converting the frequency of the differential signal amplified by the amplifier circuit;
    a feedback circuit, located across an input of the amplifier circuit and an output of the amplifier circuit and including a parallel circuit formed by a resistor and a capacitor connected to each other in parallel, for feeding the output of the amplifier circuit back to the input of the amplifier circuit while changing a phase of the differential signal passing through the feedback circuit; and
    a phase controller circuit, located between the adjusting terminals of the amplifier circuit and ground, for changing the phase of the differential signal passing through the amplifier circuit, wherein
    the amplifier circuit includes an in-phase amplifying section having an in-phase adjusting terminal, which is one of the adjusting terminals, and operating based on the in-phase signal of the differential signal, and an opposite-phase amplifying section having an opposite-phase adjusting terminal, which is another one of the adjusting terminals, and operating based on the opposite-phase signal of the differential signal, and
    the feedback circuit includes an in-phase feedback section operating based on the in-phase signal and an opposite-phase feedback section operating based on the opposite-phase signal.

6. The frequency converter according to claim 5, wherein a sum of a phase change amount in the feedback circuit and a phase change amount in the amplifier circuit is approximately 180 degrees at least in a range from a frequency of a fundamental wave of the differential signal supplied by the input terminal of the frequency converter to a frequency of a second harmonic of the differential signal.

7. The frequency converter according to claim 5, wherein the phase controller circuit includes first, second and third phase adjusting sections each having two ends, each of the first, second and third phase adjusting sections being commonly connected to a single connecting point,
    another end of the first phase adjusting section is connected to the in-phase adjusting terminal,
    another end of the second phase adjusting section is connected to the opposite-phase adjusting terminal, and
    another end of the third phase adjusting section is grounded.

8. The frequency converter according to claim 5, wherein the in-phase adjusting terminal and the opposite-phase adjusting terminal are directly connected to each other, and
    the phase controller circuit includes a phase adjusting section having two ends, one of the two ends being connected to the in-phase adjusting terminal and the opposite-phase adjusting terminal and another end being grounded.

* * * * *

UNITED STATES PATENT AND TRADEMARK OFFICE
CERTIFICATE OF CORRECTION

PATENT NO. : 7,123,073 B2
APPLICATION NO. : 10/506078
DATED : October 17, 2006
INVENTOR(S) : Toshifumi Nakatani et al.

It is certified that error appears in the above-identified patent and that said Letters Patent is hereby corrected as shown below:

ON THE TITLE PAGE

In the abstract, line 3, please replace "between the emitters" with --between emitters--.
In the abstract, line 10, please replace "and capacitors." with --and two capacitors.--.

Signed and Sealed this

Sixth Day of February, 2007

JON W. DUDAS
*Director of the United States Patent and Trademark Office*